United States Patent
Morimoto

(10) Patent No.: US 8,390,090 B2
(45) Date of Patent: Mar. 5, 2013

(54) SEMICONDUCTOR DEVICE AND METHOD OF MANUFACTURING THE SAME

(75) Inventor: Takao Morimoto, Tokyo (JP)

(73) Assignee: NEC Corporation, Tokyo (JP)

( * ) Notice: Subject to any disclaimer, the term of this patent is extended or adjusted under 35 U.S.C. 154(b) by 131 days.

(21) Appl. No.: 13/130,676

(22) PCT Filed: Nov. 18, 2009

(86) PCT No.: PCT/JP2009/006184
§ 371 (c)(1),
(2), (4) Date: May 23, 2011

(87) PCT Pub. No.: WO2010/064370
PCT Pub. Date: Jun. 10, 2010

(65) Prior Publication Data
US 2011/0221045 A1    Sep. 15, 2011

(30) Foreign Application Priority Data

Dec. 1, 2008 (JP) .................................. 2008-306151

(51) Int. Cl.
*H01L 31/00* (2006.01)
(52) U.S. Cl. ................. 257/464; 257/E21.352; 438/328
(58) Field of Classification Search .................. 257/464, 257/657, E21.352; 438/314, 328
See application file for complete search history.

(56) References Cited

U.S. PATENT DOCUMENTS 6,462,328 B2 * 10/2002 Toyoda ............................ 438/48
6,791,160 B2 * 9/2004 Ejiri et al. ...................... 257/577

FOREIGN PATENT DOCUMENTS

| JP | 4-249381 A | 9/1992 |
|---|---|---|
| JP | 2002064218 A | 2/2002 |
| JP | 2002203954 A | 7/2002 |
| JP | 2003037259 A | 2/2003 |
| JP | 2003051607 A | 2/2003 |
| JP | 2003197949 A | 7/2003 |
| JP | 2004087979 A | 3/2004 |
| JP | 2006210494 A | 8/2006 |
| JP | 2007317767 A | 12/2007 |
| JP | 2007317768 A | 12/2007 |
| JP | 4058034 B | 3/2008 |

OTHER PUBLICATIONS

International Search Report for PCT/JP2009/006164 mailed Mar. 9, 2010.

* cited by examiner

*Primary Examiner* — Chandra Chaudhari

(57) ABSTRACT

Provided is a semiconductor device with a high breakdown voltage yield of a bipolar transistor and a high bandwidth and quantum efficiency of a light receiving element. An optical semiconductor device includes monolithically integrated transistor and light receiving element. The light receiving element includes a p-type semiconductor layer, an n-type epitaxial layer formed on the p-type semiconductor layer, and an n-type diffusion layer formed on the n-type epitaxial layer. An n-type impurity concentration of the n-type diffusion layer is $3\times10^{18}$ cm$^{-3}$ or less at a depth of 0.12 μm or more below a surface of the n-type diffusion layer, $1\times10^{16}$ cm$^{-3}$ or more at a depth of 0.4 μm or less below the surface, and $1\times10^{16}$ cm$^{-3}$ or less at a depth of 0.8 μm or more below the surface, and an interface between the p-type semiconductor layer and the n-type epitaxial layer is located at a depth of 0.9 μm to 1.5 μm below the surface.

13 Claims, 4 Drawing Sheets

SEMICONDUCTOR DEVICE AND METHOD OF MANUFACTURING THE SAME

This application is the National Phase of PCT/JP2009/006184, filed Nov. 18, 2009, which is based upon and claims the benefit of priority from Japanese patent application No. 2008-306151, filed on Dec. 1, 2008, the disclosure of which is incorporated herein in its entirety by reference.

TECHNICAL FIELD

The present invention relates to a semiconductor device and, particularly, to a semiconductor device in which a transistor and a light receiving element are monolithically integrated on a semiconductor substrate, and a method of manufacturing the same.

BACKGROUND ART

In recent years, ever denser optical disc devices, like CD (Compact Disc), DVD (Digital Versatile Disc) and Blu-ray, have been developed and put to practical use. Further, in a Blu-ray optical disc device, a reading speed and a writing speed have been enhanced. With the speed enhancement, there is a demand for speed enhancement of a PDIC (Photo-diode Integrated Circuit) that is incorporated in an optical pickup. Because the speed enhancement comes with high-power laser output, the speed enhancement of the PDIC needs to be achieved also under high optical input. Further, because silicon has a high absorption coefficient for blue light, carriers generated by the light absorption are concentrated on the silicon surface. Therefore, the probability of occurrence of pair annihilation of photo-generated carriers due to surface recombination increases, and it is also an important issue to obtain the efficiency (photocurrent/incident light power).

A light receiving element (PD: photodiode) that is incorporated in an optical pickup is typically monolithically integrated on an IC (Integrated Circuit) for smaller size and lower cost. Therefore, constraints are placed on the optimizing design of the PD for the above-described issue. FIG. 7 shows a PDIC illustrated in FIG. 1 of Patent Literature 1, for example.

The PDIC in FIG. 7 includes a p-type silicon substrate 1, a p$^+$-type silicon layer 2, a p$^-$-type epitaxial layer 3, and an n-type epitaxial layer 6, and, in the course of epitaxial growth, a p-type buried diffusion layer 4 and an n-type buried diffusion layer 5 are formed. Further, a p-type separating diffusion layer 7 is formed for element separation between a PD and a bipolar transistor, and a PD part n-type diffusion layer 8 is formed in the PD region, and an n-type diffusion layer 9, a p-type base diffusion layer 10, and an n-type emitter diffusion layer 11 are formed in the bipolar transistor region. Above such a silicon substrate, a dielectric film 12 and an electrode 13 are formed.

In this PDIC, the PD and the bipolar transistor having the n-type semiconductor layer on their surfaces are monolithically integrated on the p-type silicon substrate 1. The n-type epitaxial layer 6 needs to have a thickness of about 1 μm or more for a bipolar transistor structure (cf. e.g. Patent Literature 2). In such a structure, the p-n junction position of the PD is as deep as 1 μm or more below the silicon surface, which leads to the reduction of the efficiency and the deterioration of the speed of response. The cause of the deterioration is that the absorption coefficient of silicon is large for blue light that is used in the Blu-ray optical disc device, and a depth at which the incident light intensity is 1/e is as shallow as about 0.15 μm.

In light of such concerns, PDICs described in Patent Literatures 3 to 5 adopt a technique that etches the PD region to make the p-n junction position shallower. However, an unplanarized wafer is not practical because the semiconductor process becomes difficult. Patent Literatures 6 and 7 adopt a technique that inverts the lower layer part of the n-type epitaxial layer 6 into p type by diffusion to make the p-n junction position shallower. However, it is difficult to control the concentration by a balance of p and n. The p$^-$-type epitaxial layer 3 has a concentration of as low as about $1\times10^{14}$ cm$^{-3}$, for example, in order to keep the capacitance of the PD low. It is extremely difficult to invert the n-type semiconductor layer into p type by diffusion and control it to such a low concentration.

Therefore, the optimization of a PD is typically made on the assumption that the p-n junction position is deep to some extent in consistent with a bipolar transistor. In Patent Literature 2, the thickness of the n-type epitaxial layer is 2 μm, and a high concentration region is provided so that a peak is at a depth of 0.3 to 0.7 μm. However, hole carriers that are generated on the surface side relative to the concentration peak are difficult to move to the p-type region, and the probability of pair annihilation due to surface recombination increases. The efficiency is thereby low.

In Patent Literature 8, the thickness of the n-type epitaxial layer is about 0.8 μm to 1.0 μm, and an n-type impurity concentration by ion implantation is defined to thereby achieve the quantum efficiency of 90% or higher. In this manner, the n-type impurity concentration distribution of the PD part is important.

The PD part n-type diffusion layer 8 contributes to preventing hole carriers generated by light absorption from surface recombination and improving the efficiency as described in Patent Literature 9. Further, the sheet resistance of the n-layer on the PD surface affects the speed of response of the PD as described in Patent Literature 8. The presence of the PD part n-type diffusion layer 8 is effective in terms also of decreasing resistance. The PD part n-type diffusion layer 8 may have a double ion-implantation structure as described in Patent Literature 10. If the concentration profile has a gradient, an electric field is applied to photo-generated hole carriers, and the speed of response can be enhanced.

From Patent Literatures 1, 8 and 11, the quantum efficiency of 90% or higher can be achieved by setting the n-type doping profile of the PD part n-type diffusion layer 8 as follows. When arsenic is used for ion implantation and the diffusion depth is shallow, the maximum surface concentration is set to $1\times10^{20}$ cm$^{-3}$ or less. When phosphorus is used for ion implantation and the diffusion depth is deep, the maximum surface concentration is set to $1\times10^{19}$ cm$^{-3}$ or less. Further, a good speed of response can be obtained by setting the thickness of the n-type epitaxial layer 6 (p-n junction depth) to as thin as about 0.8 to 1.0 μm. In the 3 dB bandwidth of a single PD, 500 MHz or higher can be obtained. If such a high-speed response is achieved, it becomes compatible with a 12× speed Blu-ray optical disc device.

CITATION LIST

Patent Literature

Patent Literature 1: Japanese Unexamined Patent Application Publication No. 2004-087979
Patent Literature 2: Japanese Patent No. 4058034
Patent Literature 3: Japanese Unexamined Patent Application Publication No. 2002-064218

Patent Literature 4: Japanese Unexamined Patent Application Publication No. 2003-037259

Patent Literature 5: Japanese Unexamined Patent Application Publication No. 2006-210494

Patent Literature 6: Japanese Unexamined Patent Application Publication No. 2007-317767

Patent Literature 7: Japanese Unexamined Patent Application Publication No. 2007-317768

Patent Literature 8: Japanese Unexamined Patent Application Publication No. 2003-197949

Patent Literature 9: Japanese Unexamined Patent Application Publication No. H04-249381

Patent Literature 10: Japanese Unexamined Patent Application Publication No. 2002-203954 (pp. 8-9, FIGS. 5 and 6)

Patent Literature 11: Japanese Unexamined Patent Application Publication No. 2003-051607

SUMMARY OF INVENTION

Technical Problem

The issue is that the thickness of the n-type epitaxial layer 6 is preferably thick for the bipolar transistor and is preferably thin for the PD, and therefore an appropriate range thereof is narrow. Note that, in the epitaxial growth of silicon, because of reproducibility of layer thickness, variations among wafers and variations in a wafer, it is desirable that design for the epitaxial layer thickness is made in consideration of variations of about ±0.1 μm.

Specifically, if the n-type epitaxial layer 6 is too thin, yields are reduced due to a decrease in the breakdown voltage of the bipolar transistor. In order to improve yields, a layer thickness of 1 μm or more as a design center and 0.9 μm or more as a lower limit of variation is desirable.

On the other hand, the thickness of the n-type epitaxial layer 6 is preferably thin for the bandwidth of the PD. For example, in Patent Literature 8, the thickness of the n-type epitaxial layer is 0.8 to 1.0 μm. In this case, the center of the target thickness of the n-type epitaxial layer is 0.9 μm. It is therefore difficult to obtain the breakdown voltage yield of the bipolar transistor.

In short, the optimum thickness range of the n-type epitaxial layer that satisfies both the bandwidth of the PD and the breakdown voltage of the transistor is narrow, and yields are low.

Further improvement of the 3 dB bandwidth of the PD is desirable in terms of further speed enhancement of a Blu-ray optical disc device. For example, to achieve 16× speed, the 3 dB bandwidth of about 600 MHz is necessary. On the other hand, even with 12× speed, improvement of the bandwidth of the single PD makes allowance in IC design. Further, although the 3 dB bandwidth of 500 MHz is achieved with low optical input, the bandwidth is reduced with an increase in light incident power. High power light is incident on the PDIC at writing of an optical disc device, and a settling time after the light is off is required to be short.

Thus, in view of the speed of response at high optical input, the bandwidth of the PD is lacking. This is because the thickness of the n-type epitaxial layer cannot be made thin in order to obtain the breakdown voltage yield of the integrated bipolar transistor as described above.

The present invention has been accomplished in light of the foregoing, and an object of the present invention is thus to provide a semiconductor device that offers a high breakdown voltage yield of a bipolar transistor and a high bandwidth and quantum efficiency of a light receiving element.

Solution to Problem

A semiconductor device according to the present invention includes a transistor, and a light receiving element monolithically integrated with the transistor, wherein the light receiving element includes a p-type semiconductor layer, an n-type epitaxial layer formed on the p-type semiconductor layer, and an n-type diffusion layer formed on the n-type epitaxial layer, an n-type impurity concentration of the n-type diffusion layer is $3 \times 10^{18}$ cm$^{-3}$ or less at a depth of 0.12 μm or more below a surface of the n-type diffusion layer, $1 \times 10^{16}$ cm$^{-3}$ or more at a depth of 0.4 μm or less below the surface, and $1 \times 10^{16}$ cm$^{-3}$ or less at a depth of 0.8 μm or more below the surface, and an interface between the p-type semiconductor layer and the n-type epitaxial layer is located at a depth of 0.9 μm to 1.5 μm below the surface.

A method of manufacturing a semiconductor device according to the present invention is a method of manufacturing a semiconductor device in which a transistor and a light receiving element are monolithically integrated, the method including forming an n-type epitaxial layer with a thickness of 0.9 μm to 1.5 μm on a p-type semiconductor layer, and forming an n-type diffusion layer on the n-type epitaxial layer in a formation region of the light receiving element, the n-type diffusion layer having an n-type impurity concentration of $3 \times 10^{18}$ cm$^{-3}$ or less at a depth of 0.12 μm or more below a surface of the n-type diffusion layer, $1 \times 10^{16}$ cm$^{-3}$ or more at a depth of 0.4 μm or less, and $1 \times 10^{16}$ cm$^{-3}$ or less at a depth of 0.8 μm or more.

Advantageous Effects of Invention

According to the present invention, it is possible to provide a semiconductor device that offers a high breakdown voltage yield of a bipolar transistor and a high bandwidth and quantum efficiency of a light receiving element.

DESCRIPTION OF EMBODIMENTS

Exemplary embodiments of the present invention will be described in detail hereinbelow. The present invention, however, is not limited to the below-described embodiments. The following description and the attached drawings are appropriately shortened and simplified to clarify the explanation.

First Exemplary Embodiment

Figure 1:
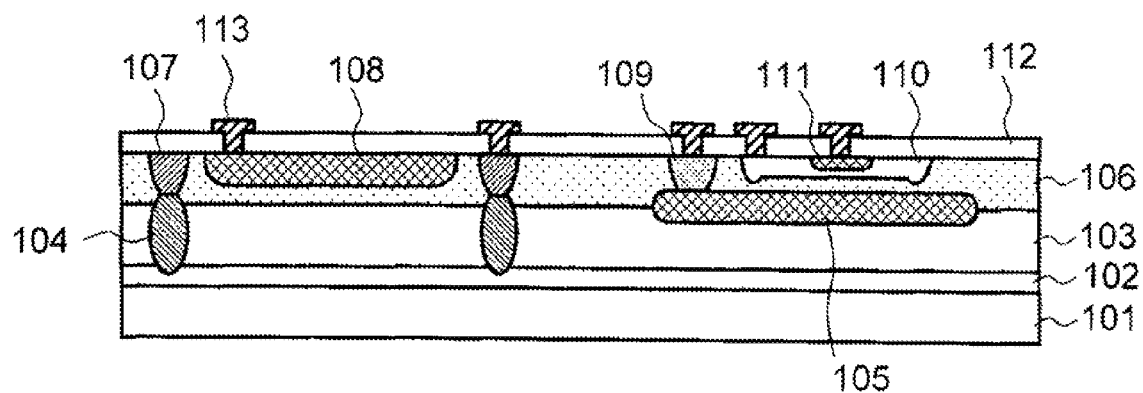
FIG. 1 is a cross-sectional view of a PDIC according to first and second exemplary embodiments.

FIG. 1 is a cross-sectional view of a PDIC according to a first exemplary embodiment of the present invention. In the PDIC, a $p^+$-type silicon layer 102, a $p^-$-type epitaxial layer 103 and a n-type epitaxial layer 106 are formed on a p-type silicon substrate 101. The p-type impurity concentration of the $p^-$-type epitaxial layer 103 is $1 \times 10^{14}$ cm$^{-3}$.

The thickness of the n-type epitaxial layer 106 is 1.2±0.1 μm, and the n-type impurity concentration thereof is 3~6× $10^{15}$ cm$^{-3}$. Note that the thickness of the n-type epitaxial layer 106 may be 1.0 to 1.4 μm, and the n-type impurity concentration thereof may be 1~8×$10^{15}$ cm$^{-3}$. In the epitaxial growth, reproducibility of the growth layer thickness, variations among wafers and variations in a wafer exist. The thickness of the n-type epitaxial layer 106 is preferably within the range of 0.9 μm to 1.5 μm considering such variations.

In the course of epitaxial growth, a p-type buried diffusion layer 104 and an n-type buried diffusion layer 105 are formed. Further, a p-type separating diffusion layer 107 is formed for element separation between a PD and a bipolar transistor. In the PD region, a PD part n-type diffusion layer 108 is formed, and, in the bipolar transistor region, an n-type diffusion layer 109, a p-type base diffusion layer 110, and an n-type emitter diffusion layer 111 are formed. Above such a silicon crystal, a dielectric film 112 is formed, and an electrode 113 is placed.

Figure 2:
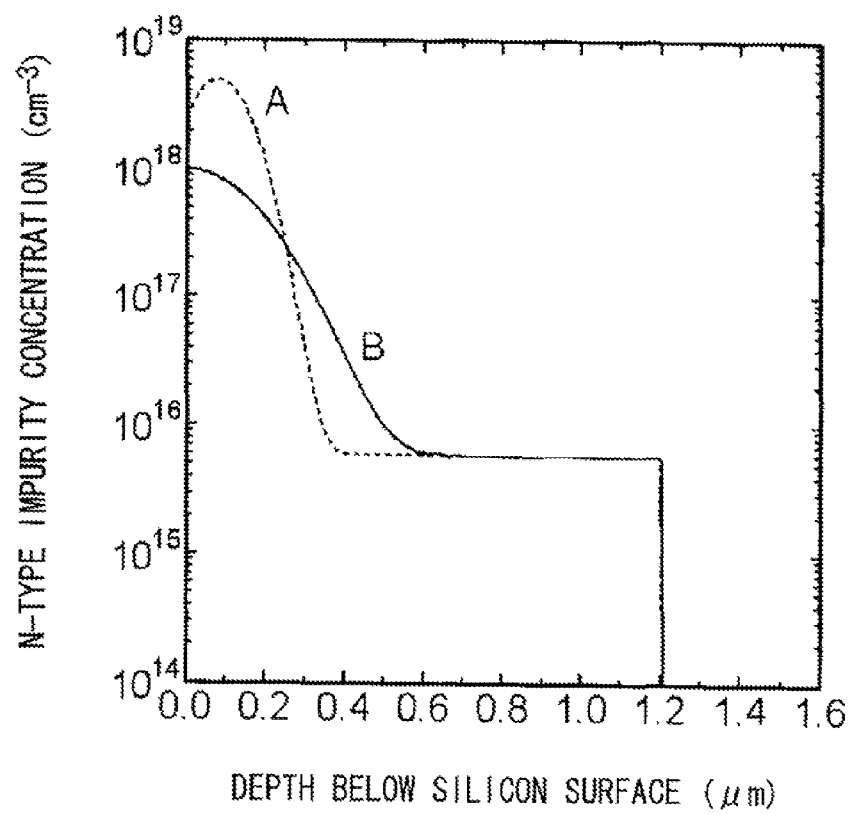
FIG. 2 is a graph showing an n-type doping profile of a semiconductor light receiving device according to the first exemplary embodiment.
Figure 3:
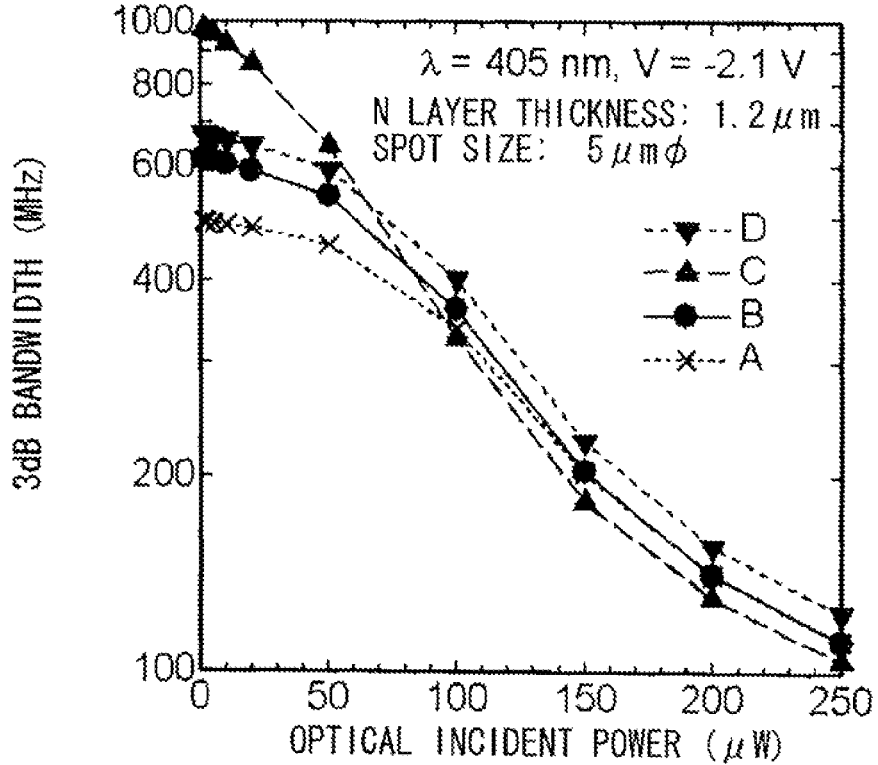
FIG. 3 is a graph showing an effect according to the exemplary embodiment.

In this PDIC, the n-type impurity concentration distribution of the PD part n-type diffusion layer 108 has a significant influence upon the bandwidth and the efficiency of the PD. FIG. 2 shows two different doping profiles A and B. FIG. 3 shows a result of calculating the dependence of the 3 dB bandwidth on a light incident power on the assumption of such doping profiles.

In the case of the profile A, the 3 dB bandwidth with an incidence of 10 μW is 489 MHz. However, the bandwidth becomes 522 MHz when the thickness of the n-type epitaxial layer 106 changes to 1.16 μm, and decreases to 461 MHz when it changes to 1.24 μm. Because the bandwidth varies sensitively in this manner, it is desirable to achieve the bandwidth with allowance at a design center in order to obtain a sufficiently high yield. In the profile B, the 3 dB bandwidth with an incidence of 10 μW is 603 MHz, which is about 1.2 times that of the profile A.

In addition, while the bandwidth decreases with an increase in light incident power, the bandwidth of 500 MHz or more is obtained up to 60 μW in the profile B, and the maximum incident power with which the bandwidth of 500 MHz can be obtained is significantly improved compared to the profile A. Regarding the quantum efficiency, when calculated on the assumption that a surface recombination rate is $1 \times 10^4$ cm/s, it is 95.6% in the profile A, whereas it is improved to 97.8% for in profile B.

In view of the calculation result of both the bandwidth and the efficiency, the profile B is obviously superior to the profile A. This is because the profile B satisfies the following conditions to achieve high efficiency and high bandwidth, while the profile A does not satisfy them.

First, the n-type impurity concentration peak depth position is within 0.05 μm from the silicon surface. Further, the n-type impurity concentration is $3 \times 10^{18}$ cm$^{-3}$ or lower at a depth of 0.1 μm. Furthermore, the n-type impurity concentration is $2 \times 10^{16}$ cm$^{-3}$ or higher at a depth of 0.4 μm. Among such characteristics, the condition that the n-type impurity concentration at a depth of 0.1 μm is lower than a certain degree has the effect of improving the efficiency. Further, the condition that the n-type impurity concentration is distributed at a level of $2 \times 10^{16}$ cm$^{-3}$ or higher up to the depth of 0.4 μm has the effect of sufficiently narrowing a region in which an electric field is low due to the absence of a concentration gradient and thereby the bandwidth is improved.

The calculation method is described hereinbelow.

The inventor conducted a quantitative study in order to maintain a high quantum efficiency of a PD that is integrated with a bipolar IC and improve the 3 dB bandwidth from 550 MHz. As a result, the inventor succeeded in achieving both the 3 dB bandwidth exceeding 500 MHz and the quantum efficiency exceeding 95% in a blue PD for an optical pickup which is supposed to be integrated with a bipolar IC and which has n-type silicon on its surface.

As for the quantum efficiency, it is known that the quantum efficiency of 90% or higher can be obtained when the maximum surface concentration of an n-type impurity is equal to or lower than $1 \times 10^{19}$ cm$^{-3}$. According to experimental data of Patent Literatures 1, 8 and 11, any particular concentration dependence ceases to be seen below $1 \times 10^{19}$ cm$^{-3}$. More specifically, it is also dependent on the diffusion depth of an n-type impurity. This is because an electric field exerted on photo-generated hole carriers changes with a change in concentration gradient, and the surface recombination probability changes accordingly. According to FIG. 4 of Patent Literature 1, the maximum surface concentration with which the quantum efficiency is sufficiently high and the concentration dependence disappears is $1 \times 10^{20}$ cm$^{-3}$ or lower when the n-type impurity diffusion layer depth is 0.3 μm, whereas it is $1 \times 10^{19}$ cm$^{-3}$ or lower when the n-type impurity diffusion layer depth is 1.2 μm.

As for the bandwidth, it is known that the bandwidth can be improved when the n-type concentration distribution is such that the concentration is high at the surface and is reduced with a gradient at a certain depth or more. It is also known that the bandwidth can be improved when the p-n junction position is shallower. However, these are qualitative findings, not quantitative findings. For a quantitative study, a bandwidth change due to resistance is disclosed in Patent Literature 8.

However, because the bandwidth largely depends not only on the resistance but also on the time for photo-generated hole carriers to be transported to the p-layer, a quantitative study thereof is desired. From the viewpoint of transport phenomenon of hole carriers, the bandwidth is improved as the p-n junction position is shallower. When it is necessary to deepen the p-n junction position for some other reason, it is extremely difficult to obtain a high bandwidth. It is therefore necessary to deeply analyze the transport phenomenon of hole carriers and closely study the n-type impurity concentration distribution.

The inventor set the design center of the thickness of the n-type epitaxial layer 106 to 1.2 μm with a view to sufficiently enhancing the yield of a monolithically integrated bipolar transistor in consideration of variations in the thickness of the n-type epitaxial layer 106. It is not easy to obtain a bandwidth of 500 MHz or more with such a large thickness. Thus, the transport phenomenon of carriers was analyzed in detail by numerical calculation.

In the calculation, a surface recombination rate that dominates the quantum efficiency is set to $1 \times 10^4$ cm/s as described above. Although this value can vary depending upon the process conditions, as the high-low relationship of the quantum efficiency remains unchanged, the direction of improving the quantum efficiency is recognizable.

Figure 4:
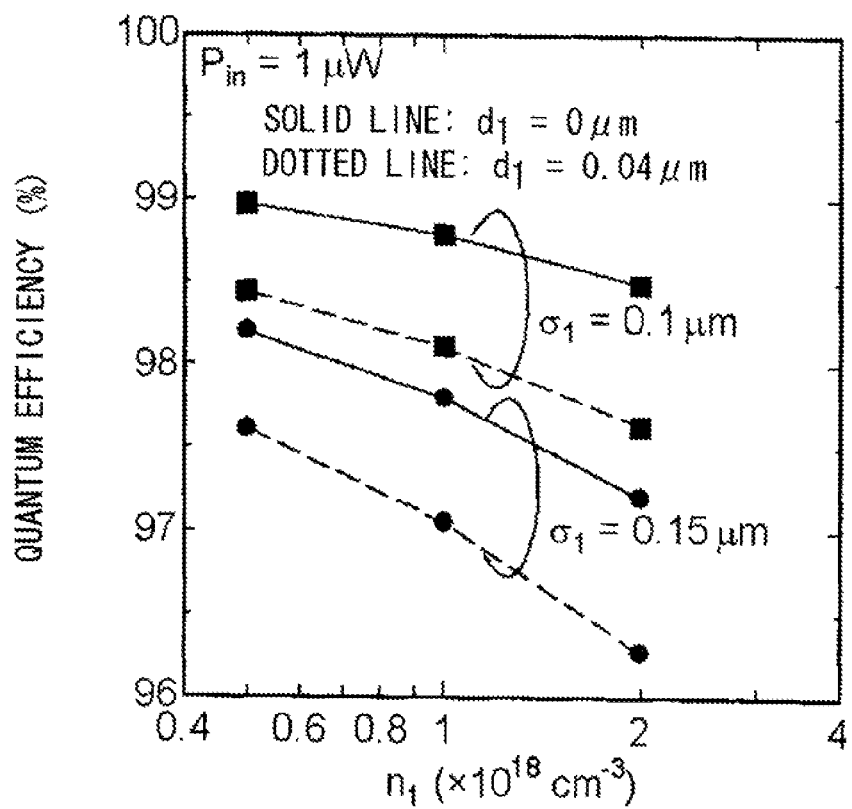
FIG. 4 is a graph showing $n_1$ dependence of quantum efficiency to explain an action according to the exemplary embodiment.
Figure 5:
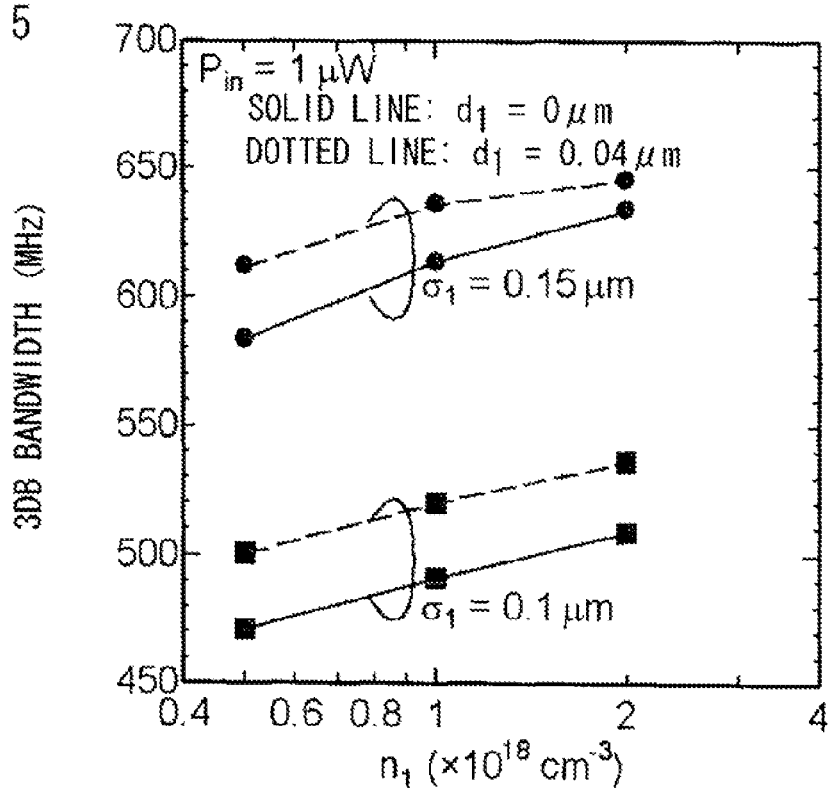
FIG. 5 is a graph showing $n_1$ dependence of 3 dB bandwidth to explain an action according to the exemplary embodiment.

FIG. 4 shows a calculation result of the $n_1$ dependence of the quantum efficiency, and FIG. 5 shows the $n_1$ dependence of the 3 dB bandwidth of the PD. As a general formula of an n-type impurity concentration (doping profile) c by ion implantation, Gaussian distribution represented by Equation 1 was assumed.

$$c = n_1 \times \exp(-(x-d_1)^2/(2\sigma_1^2))$$ Equation 1:

x is a depth below a silicon surface. $n_1$, $d_1$ and $\sigma_1$ are parameters. $n_1$ indicates a maximum concentration in each Gaussian distribution. $d_1$ indicates a depth to provide the maximum concentration $n_1$ in each Gaussian distribution. $\sigma_1$ is a deviation in depth.

As a result of the calculation, it was newly found that, even when the maximum concentration falls below $1 \times 10^{19}$ cm$^{-3}$, the efficiency still depends on the maximum concentration. This is because the electron concentration of the other element of pair annihilation changes due to surface recombination. Further, it newly turned out that the bandwidth and the efficiency are in a trade-off relationship with respect to the parameters $n_1$, $d_1$ and $\sigma_1$. It has been known that the mobility of hole carriers is related both with bandwidth improvement and efficiency improvement. However, it has been unknown that there is a trade-off relationship between the bandwidth and the efficiency.

From such new findings, it newly turned out that it is effective to place stringent restrictions on the doping profile in order to achieve both the high quantum efficiency and the high bandwidth. As a result of performing calculation with varying parameters $n_1$, $d_1$ and $\sigma_1$, the inventor found that it is desirable to satisfy the following conditions.

First, FIG. 4 shows a calculation result of the $n_1$ dependence of the quantum efficiency. As shown in FIG. 4, the line graph indicated by ● shows the case of the parameter $\sigma_1 = 0.15$ [μm], and the line graph indicated by ■ shows the case of the parameter $\sigma_1 = 0.1$ [μm]. Further, the line graph indicated by the solid line shows the case of the parameter $d_1 = 0$ [μm], and the line graph indicated by the dotted line shows the case of the parameter $d_1 = 0.04$ [μm].

On the basis of FIG. 4, high quantum efficiency can be obtained by narrowing $\sigma_1$ and lowering $n_1$. In other words, $\sigma_1$ should be narrow when $n_1$ is high, and $n_1$ should be low when $\sigma_1$ is wide. Specifically, when the maximum concentration is high, the concentration gradient is should be steep, and when the maximum concentration is low, the concentration gradient can be moderate. Defining these all together, restrictions can be placed that the concentration is lower than a certain value at a certain depth position. Specifically, the n-type impurity concentration is preferably $3 \times 10^{18}$ cm$^{-3}$ or lower at a depth of 0.12 μm. More preferably, the n-type impurity concentration is $3 \times 10^{18}$ cm$^{-3}$ or lower at a depth of 0.1 μm. Further, the quantum efficiency strongly depends on $d_1$. $d_1$ is preferably 0.05 μm or less.

FIG. 5 shows the $n_1$ dependence of the 3 dB bandwidth of the PD. As shown in FIG. 5, the line graph indicated by ● shows the case of the parameter $\sigma_1 = 0.15$ [μm], and the line graph indicated by ■ shows the case of the parameter $\sigma_1 = 0.1$ [μm]. Further, the line graph indicated by the solid line shows the case of the parameter $d_1 = 0$ [μm], and the line graph indicated by the dotted line shows the case of the parameter $d_1 = 0.04$ [μm].

On the basis of FIG. 5, the bandwidth is more suitable as $\sigma_1$ is wider. This is because, when $\sigma_1$ is narrow, the n-type impurity concentration stays constant at an epitaxial growth doping concentration, and an electric field by the concentration gradient fails to be obtained in a region where an ion implantation profile is unreachable. On the other hand, when $\sigma_1$ is too wide, the quantum efficiency is degraded. This is because a region in which a concentration stays high with a small change extends to near the surface, and thereby an electric field that pulls hole carriers away from the surface ceases to be applied. In this manner, although there is an appropriate range for $\sigma_1$, it can be defined at the position in which the n-type impurity concentration falls down to $1 \times 10^{16}$ cm$^{-3}$. The position is preferably at a depth of 0.4 μm to 0.8 μm below the silicon surface. More preferably, the n-type impurity concentration is $2 \times 10^{16}$ cm$^{-3}$ or higher at a depth of 0.4 μm.

However, because the collector resistance of the bipolar transistor increases if the concentration at the position of 0.8 μm is too low, it is preferably $1 \times 10^{15}$ cm$^{-3}$ or higher at the depth of 0.4 μm to 0.8 μm. Further, as a result of the calculation, it turned out that, when the concentration of the n-type epitaxial layer 106 is too low, the bandwidth at high optical input decreases. This can be observed by comparing the curved lines C and D in FIGS. 3 and 6, for example. In this point of view also, it is not preferable that the n-type impurity concentration at the position of 0.8 μm is too low. More preferably, it is $2 \times 10^{15}$ cm$^{-3}$ or higher.

Further, it is desirable that the p-n junction depth is within a certain range. The lower limit is determined depending on the bipolar transistor structure, and it is preferably 0.9 μm or more. More preferably, it is 1.0 μm or more. Still more preferably, it is 1.1 μm or more. Further, the upper limit of the p-n junction depth is determined depending on the bandwidth of the PD for blue light, and it is preferably 1.5 μm or less. More preferably, it is 1.4 μm or less. Still more preferably, it is 1.3 μm or less.

A manufacturing method according to the first exemplary embodiment is described hereinafter with reference to FIG. 6.

First, the p$^+$-type silicon layer 102 and the p$^-$-type epitaxial layer 103 are formed on the p-type silicon substrate 101. Next, the p-type buried diffusion layer 104 and the n-type buried diffusion layer 105 are formed. Then, the n-type epitaxial layer 106 is formed by crystal growth over the whole area. Then, the p-type separating diffusion layer 107 is formed, and the PD part n-type diffusion layer 108 is formed in the PD region by double ion implantation of phosphorus or arsenic. Arsenic with a low diffusion coefficient is preferable for shallow ion implantation, whereas phosphorus or arsenic with an enhanced ion implantation energy is preferable for deep implantation. In the bipolar transistor region, the n-type diffusion layer 109, the p-type base diffusion layer 110 and the n-type emitter diffusion layer 111 are formed. After that, the dielectric film 112 is formed all over the silicon surface, and openings are made. Finally, the electrode 113 is formed in each opening, and thereby the PDIC is produced.

In this exemplary embodiment, a process that performs the ion implantation for forming the n-type diffusion layer 109 in the bipolar transistor region differently from the ion implantation for forming the PD part n-type diffusion layer 108 is adopted. Therefore, the doping profile of the PD part n-type diffusion layer 108 can be designed independently of the bipolar transistor. This enables detailed design for improving the PD bandwidth and the efficiency.

Second Exemplary Embodiment

Figure 6:
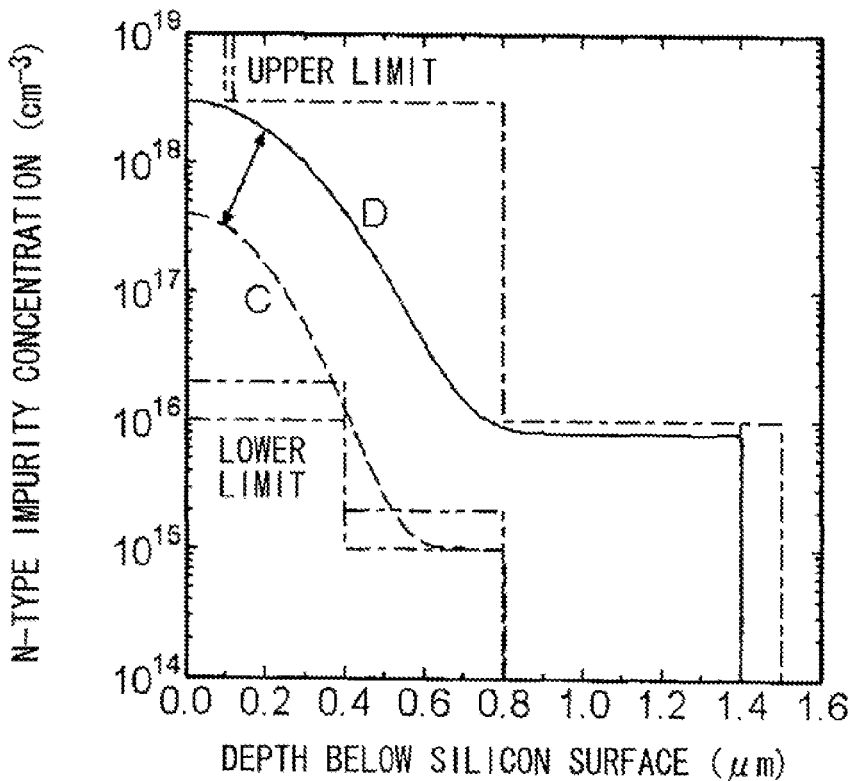
FIG. 6 is a graph showing an n-type doping profile of a semiconductor light receiving device according to the second exemplary embodiment.
Figure 7:
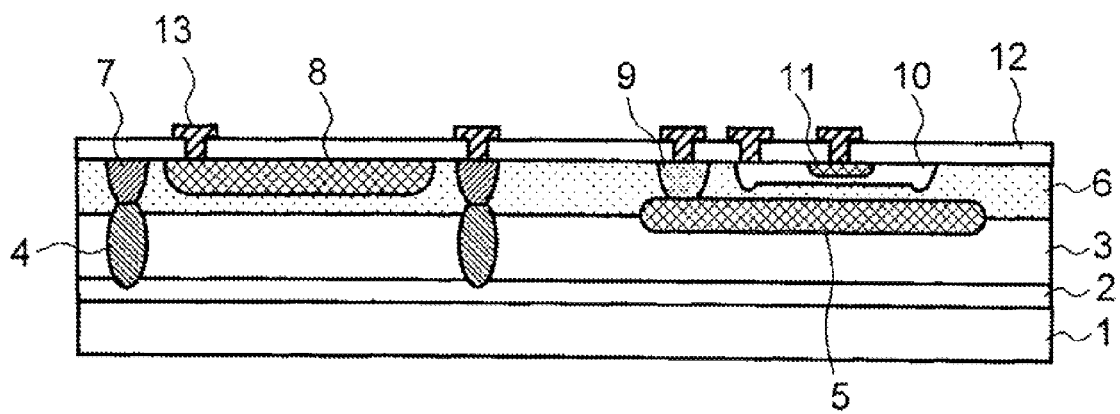
FIG. 7 is a cross-sectional view of a PDIC illustrated in FIG. 1 of Patent Literature 1.

In the above-described first exemplary embodiment, the doping profile of the PD part n-type diffusion layer 108 may be somewhere between C and D shown in FIG. 6. In the second exemplary embodiment, the profile C and the profile D, which are the lower limit and the upper limit, are used. FIG. 3 shows a calculation result of the light incident power dependence of the 3 dB bandwidth of the profiles C and D. The 3 dB bandwidth at 10 μW input of the profile C is 926 MHz, and that of the profile D is 685 MHz. They are improved to 1.9 times and 1.35 times, respectively, compared to the profile A. Further, the profiles C and D both achieve a high bandwidth of 500 MHz or more up to 70 μW, and the light incident power with which a bandwidth of 500 MHz can be obtained is significantly higher than the profile A. A calculated value of quantum efficiency is 98.5% in the profile C and 95.1% in the profile D, both of which satisfy 95% or more. If the concentration is higher than that of the profile D, high quantum efficiency cannot be obtained, which is not desirable.

For convenience of calculation, a ring electrode with an inside diameter of 84 μmφ is assumed as an n-electrode of the PD, and it is assumed that light of 5 μmφ (the spot diameter is defined as a diameter with which light intensity is 1/e) is incident on the center. In this case, resistance between the light incident position and the n-electrode is 846Ω in the profile C and 275Ω in the profile D. If the concentration is lower than that of the profile C, the resistance value increases and the bandwidth at high optical input decreases as is obvious from FIG. 3, which is not desirable.

The profile C is represented by $c_1$ [cm$^{-3}$] in the following Equation 2, and the profile D is represented by $c_2$ [cm$^{-3}$] in the following Equation 3.

$$c_1 = 4 \times 10^{17} \times \exp(-x^2/(2 \times 0.15^2)) + 1 \times 10^{15} \qquad \text{Equation 2:}$$

$$c_2 = 3 \times 10^{18} \times \exp(-x^2/(2 \times 0.2^2)) + 8 \times 10^{15} \qquad \text{Equation 3:}$$

At $0 \leq x \leq 0.8$, if the doping profile is somewhere between the both, all of a good bandwidth, a good efficiency and a low resistance are satisfied, and suitable performance, which is significantly improved compared to a profile outside the range of C and D, such as the profile A, can be obtained.

Further, the profiles C and D may be selectively used according to application. In a playback-only optical disc device, the profile C can be used because it is only necessary that a bandwidth at low optical input is high. In a recording optical disc device, the profile D with a high bandwidth at high optical input is suitable because it is necessary to reduce a settling time after high optical input is off.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

INDUSTRIAL APPLICABILITY

The present invention is applicable to a PDIC that is incorporated in an optical pickup, for example.

REFERENCE SIGNS LIST

101 P-TYPE SILICON SUBSTRATE
102 P$^+$-TYPE SILICON LAYER
103 P$^-$-TYPE EPITAXIAL LAYER
104 P-TYPE BURIED DIFFUSION LAYER
105 N-TYPE BURIED DIFFUSION LAYER
106 N-TYPE EPITAXIAL LAYER
107 P-TYPE SEPARATING DIFFUSION LAYER
108 PD PART N-TYPE DIFFUSION LAYER
109 N-TYPE DIFFUSION LAYER
110 P-TYPE BASE DIFFUSION LAYER
111 N-TYPE EMITTER DIFFUSION LAYER
112 DIELECTRIC FILM
113 ELECTRODE

The invention claimed is:

1. A semiconductor device comprising:
a transistor; and
a light receiving element monolithically integrated with the transistor, wherein
the light receiving element includes
a p-type semiconductor layer,
an n-type epitaxial layer formed on the p-type semiconductor layer, and
an n-type diffusion layer formed on the n-type epitaxial layer,
an n-type impurity concentration of the n-type diffusion layer is $3 \times 10^{18}$ cm$^{-3}$ or less at a depth of 0.12 μm or more below a surface of the n-type diffusion layer, $1 \times 10^{16}$ cm$^{-3}$ or more at a depth of 0.4 μm or less below the surface, and $1 \times 10^{16}$ cm$^{-3}$ or less at a depth of 0.8 μm or more below the surface, and
an interface between the p-type semiconductor layer and the n-type epitaxial layer is located at a depth of 0.9 μm to 1.5 μm below the surface.

2. The semiconductor device according to claim 1, wherein a peak of the n-type impurity concentration is located within a depth of 0.05 μm below the surface.

3. The semiconductor device according to claim 1, wherein the n-type impurity concentration is $1 \times 10^{15}$ cm$^{-3}$ or more at a depth of 0.4 to 0.8 μm below the surface.

4. The semiconductor device according to claim 1, wherein the n-type impurity concentration is $3 \times 10^{18}$ cm$^{-3}$ or less at a depth of 0.1 μm or more below the surface, and $2 \times 10^{16}$ cm$^{-3}$ or more at a depth of 0.4 μm or less below the surface.

5. The semiconductor device according to claim 1, wherein an interface position between the p-type semiconductor layer and the n-type epitaxial layer is at a depth of 1.0 μm to 1.4 μm below the surface.

6. The semiconductor device according to claim 1, wherein an n-type impurity concentration c [cm$^{-3}$] at a depth of x[μm] below the surface satisfies $c_1 \leq c \leq c_2$ ($c_1$ and $c_2$ [cm$^{-3}$] are given by expressions below) at $0 \leq x \leq 0.8$:

$$c_1 = 4 \times 10^{17} \times \exp(-x^2/(2 \times 0.15^2)) + 1 \times 10^{15},$$

$$c_2 = 3 \times 10^{18} \times \exp(-x^2/(2 \times 0.2^2)) + 8 \times 10^{15}.$$

7. The semiconductor device according to claim 1, wherein the transistor is a bipolar transistor.

8. A method of manufacturing a semiconductor device with a transistor and a light receiving element monolithically integrated, comprising:
forming an n-type epitaxial layer with a thickness of 0.9 μm to 1.5 μm on a p-type semiconductor layer; and
forming an n-type diffusion layer on the n-type epitaxial layer in a formation region of the light receiving element, the n-type diffusion layer having an n-type impurity concentration of $3 \times 10^{18}$ cm$^{-3}$ or less at a depth of 0.12 μm or more below a surface of the n-type diffusion layer, $1 \times 10^{16}$ cm$^{-3}$ or more at a depth of 0.4 μm or less, and $1 \times 10^{16}$ cm$^{-3}$ or less at a depth of 0.8 μm or more.

9. The method of manufacturing a semiconductor device according to claim 8, wherein the n-type diffusion layer is formed in such a way that a peak of the n-type impurity concentration is located within a depth of 0.05 μm below the surface.

10. The method of manufacturing a semiconductor device according to claim 8, wherein the n-type diffusion layer is formed in such a way that the n-type impurity concentration is $1 \times 10^{15}$ cm$^{-3}$ or more at a depth of 0.4 to 0.8 μm below the surface.

11. The method of manufacturing a semiconductor device according to claim 8, wherein the n-type diffusion layer is formed in such a way that the n-type impurity concentration is $3\times10^{-8}$ cm$^{-3}$ or less at a depth of 0.1 μm or more below the surface, and $2\times10^{16}$ cm$^{-3}$ or more at a depth of 0.4 μm or less below the surface.

12. The method of manufacturing a semiconductor device according to claim 8, wherein the n-type epitaxial layer with a thickness of 1.0 μm to 1.4 μm is formed on the p-type semiconductor layer.

13. The method of manufacturing a semiconductor device according to claim 8, wherein the n-type diffusion layer is formed in such a way that an n-type impurity concentration c [cm$^{-3}$] at a depth of x[μm] below a surface of the n-type diffusion layer satisfies $c_1 \leqq c \leqq c_2$ ($c_1$ and $c_2$ [cm$^{-3}$] are given by expressions below) at $0 \leqq x \leqq 0.8$:

$$c_1 = 4\times10^{17} \times \exp(-x^2/(2\times0.15^2)) + 1\times10^{15},$$

$$c_2 = 3\times10^{18} \times \exp(-x^2/(2\times0.2^2)) + 8\times10^{15}.$$

\* \* \* \* \*